United States Patent
Sugito et al.

(10) Patent No.: US 6,719,040 B2
(45) Date of Patent: Apr. 13, 2004

(54) COOLING APPARATUS BOILING AND CONDENSING REFRIGERANT WITH IMPROVED TUNNEL STRUCTURE

(75) Inventors: Hajime Sugito, Nagoya (JP); Hiroyuki Osakabe, Aichi-pref. (JP); Shinichi Morihira, Kariya (JP); Yuhei Kunikata, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/244,004

(22) Filed: Sep. 13, 2002

(65) Prior Publication Data
US 2003/0079863 A1 May 1, 2003

(30) Foreign Application Priority Data

Sep. 14, 2001 (JP) ........................... 2001-279652
Feb. 12, 2002 (JP) ........................... 2002-033736

(51) Int. Cl.$^7$ .............................................. F28D 15/00
(52) U.S. Cl. .......................... 165/104.21; 165/104.33; 361/700; 257/715
(58) Field of Search .................. 165/104.33, 104.21, 165/101.26, 153, 166, 167, 173, 80.3, 185; 361/700; 257/714, 715; 174/16.3, 15.2

(56) References Cited

U.S. PATENT DOCUMENTS 5,678,422 A * 10/1997 Yoshii et al. ............... 165/153
6,341,645 B1 * 1/2002 Tanaka et al. ............ 165/104.33
6,397,935 B1 * 6/2002 Yamamoto et al. ...... 165/104.26

FOREIGN PATENT DOCUMENTS

JP          2001-116474        4/2001

* cited by examiner

Primary Examiner—Christopher Atkinson
(74) Attorney, Agent, or Firm—Harness, Dickey & Pierce, PLC

(57) ABSTRACT

A first intermediate plate 5C adjacent to a heat receiving plate 5A and a second intermediate plate 5D adjacent to the first intermediate plate 5C are provided so that the slit width of the openings (first opening 5a) in the first intermediate plate 5C is wider than that (second opening 5b) in the second intermediate plate 5D. In this way, when the first intermediate plate 5C and the second intermediate 5D are stacked, a tunnel structure is formed in which the opening dimension L3 (the opening dimension of the second openings 5b) of the communicating sections through which the first openings 5a and the second openings 5b communicate with each other is smaller than the length L2 (the opening dimension of the first openings 5a) of the tunnel portions (L2>L3). Therefore, a heat-generating member with large density of heat generation can be effectively cooled.

7 Claims, 18 Drawing Sheets

(AN ENLARGED VIEW OF PART A)

Fig.5
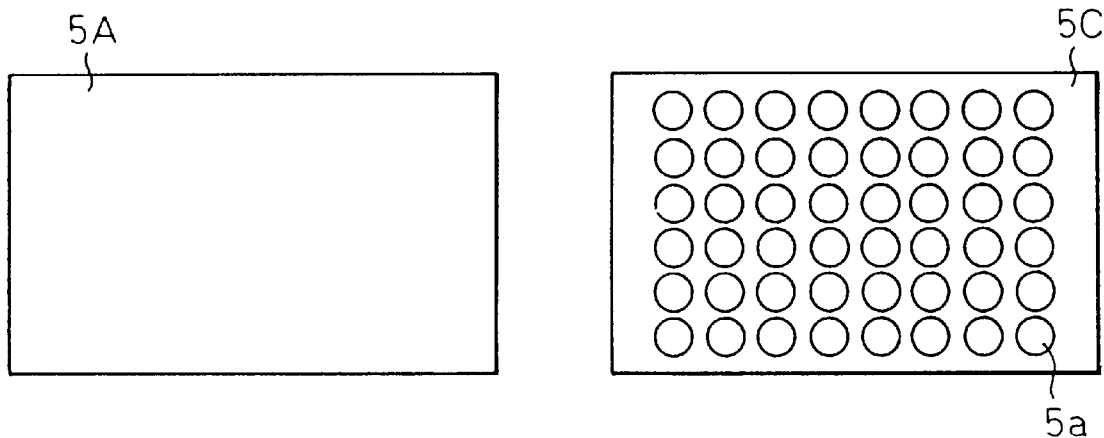
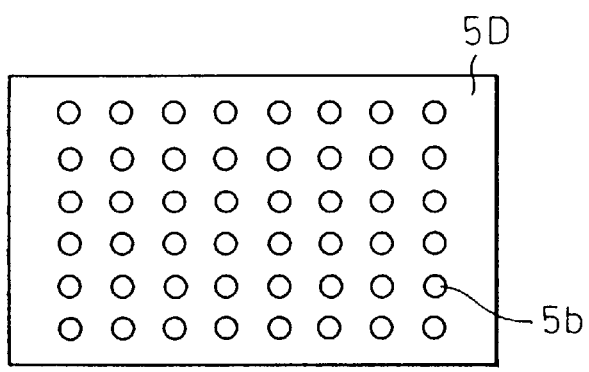
Fig.6
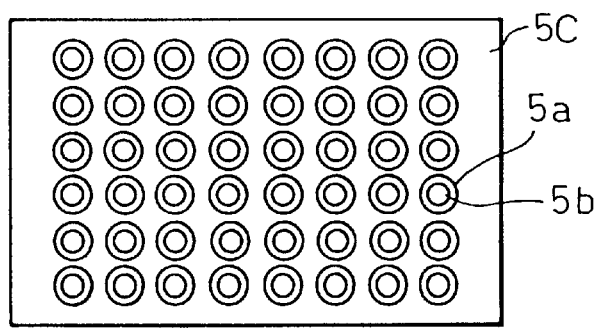

Fig.7
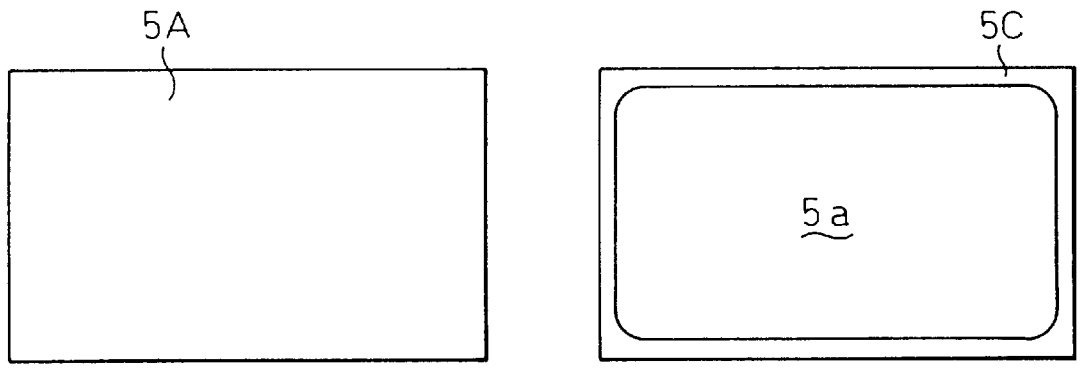
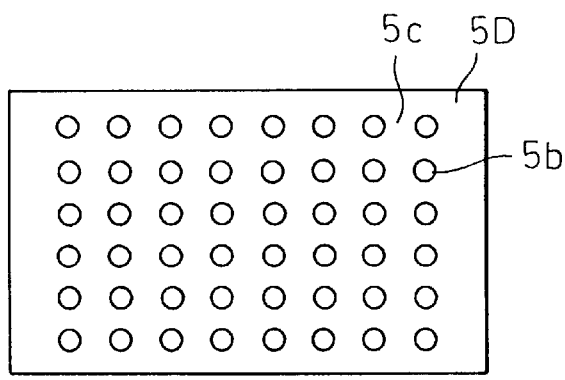
Fig.8
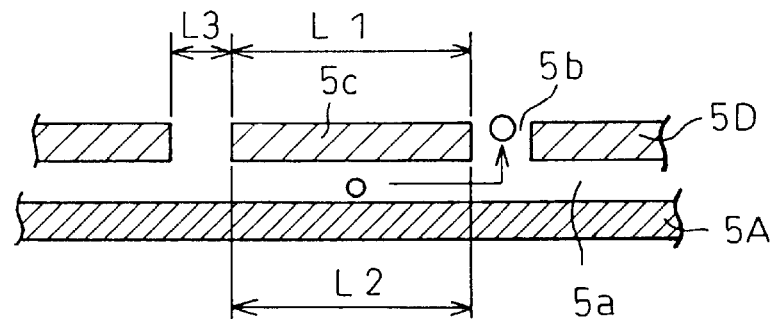

Fig. 12A
Fig. 12B
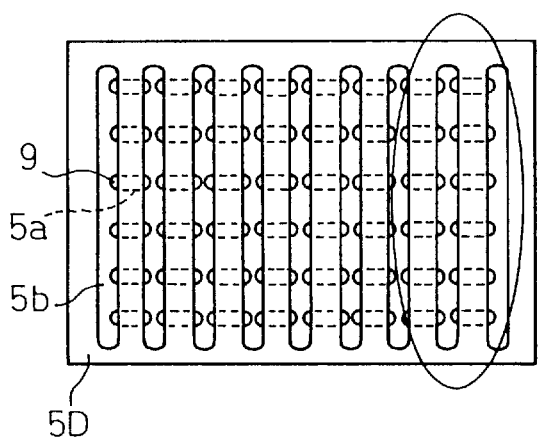
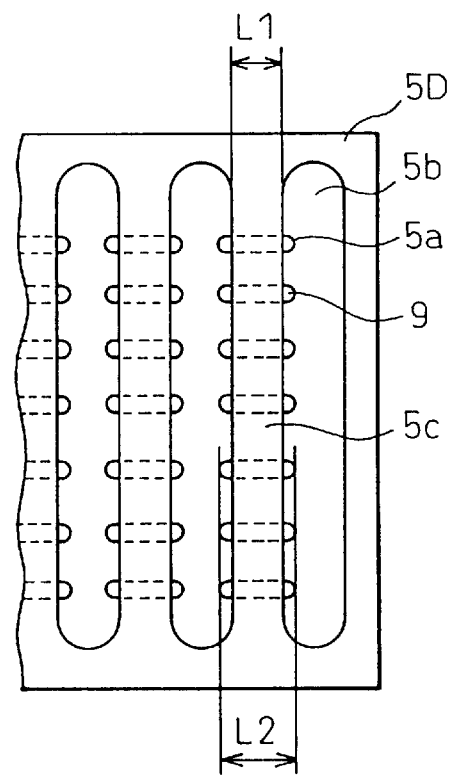

Fig.15
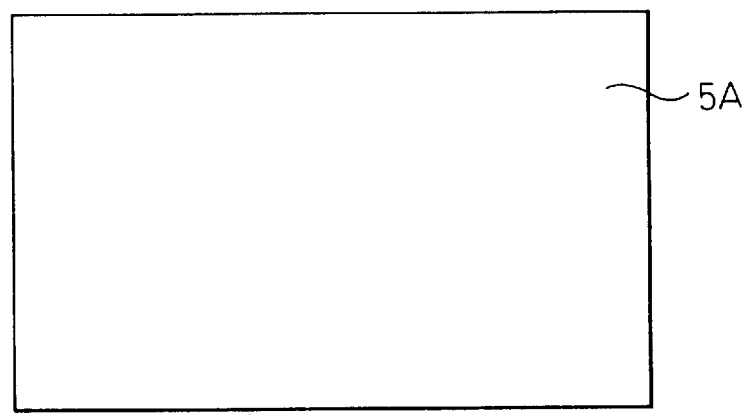
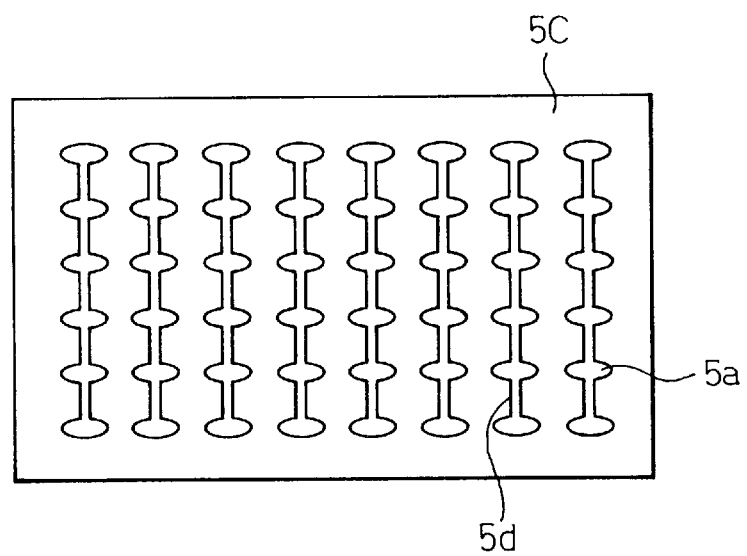
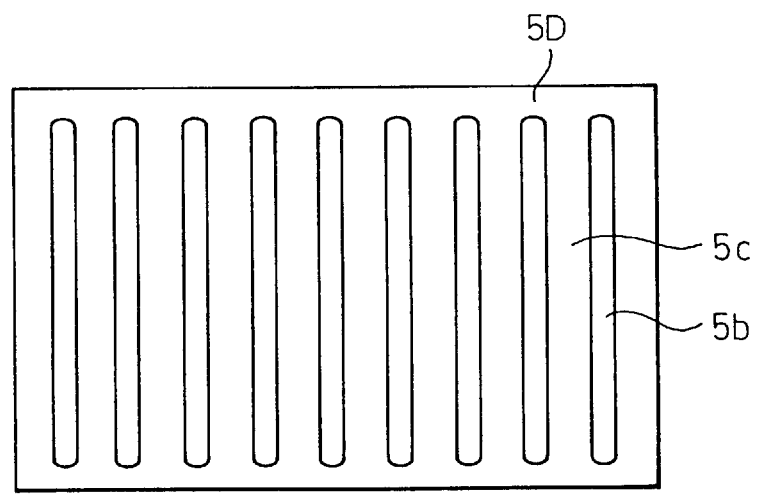

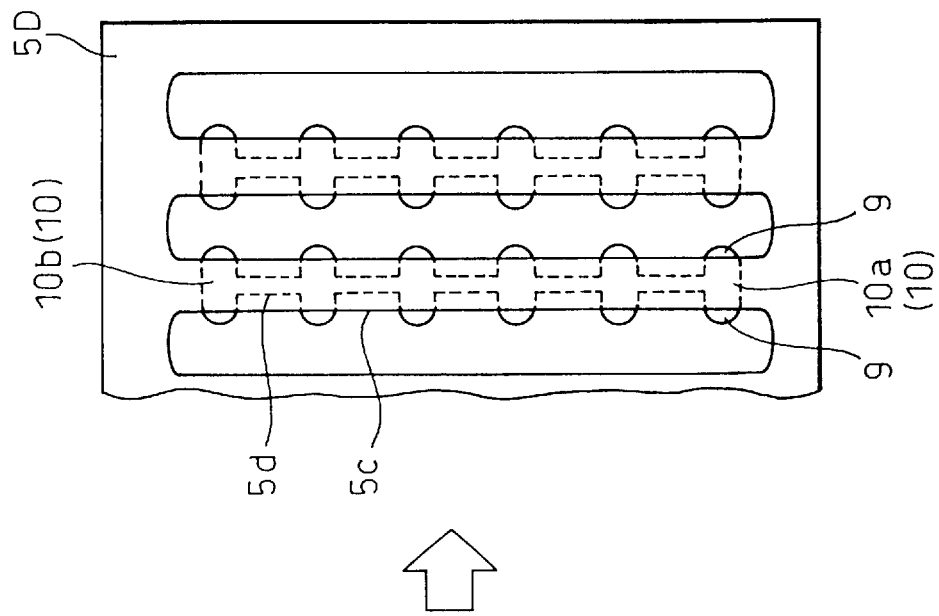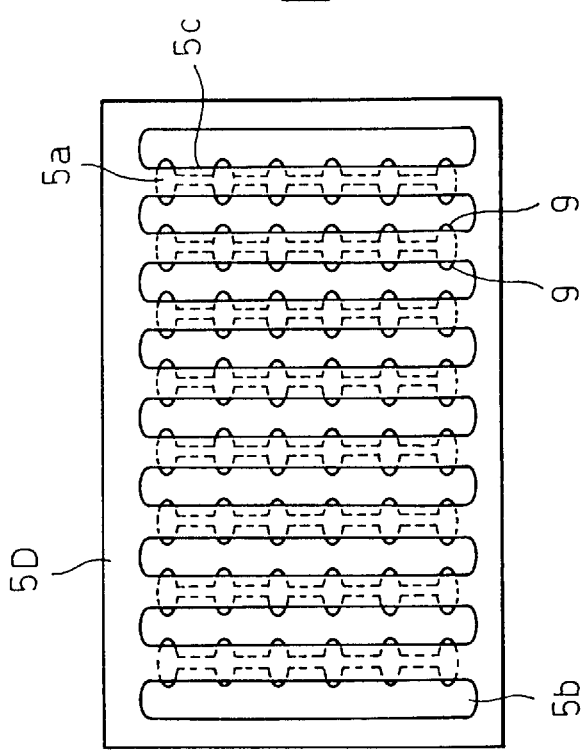

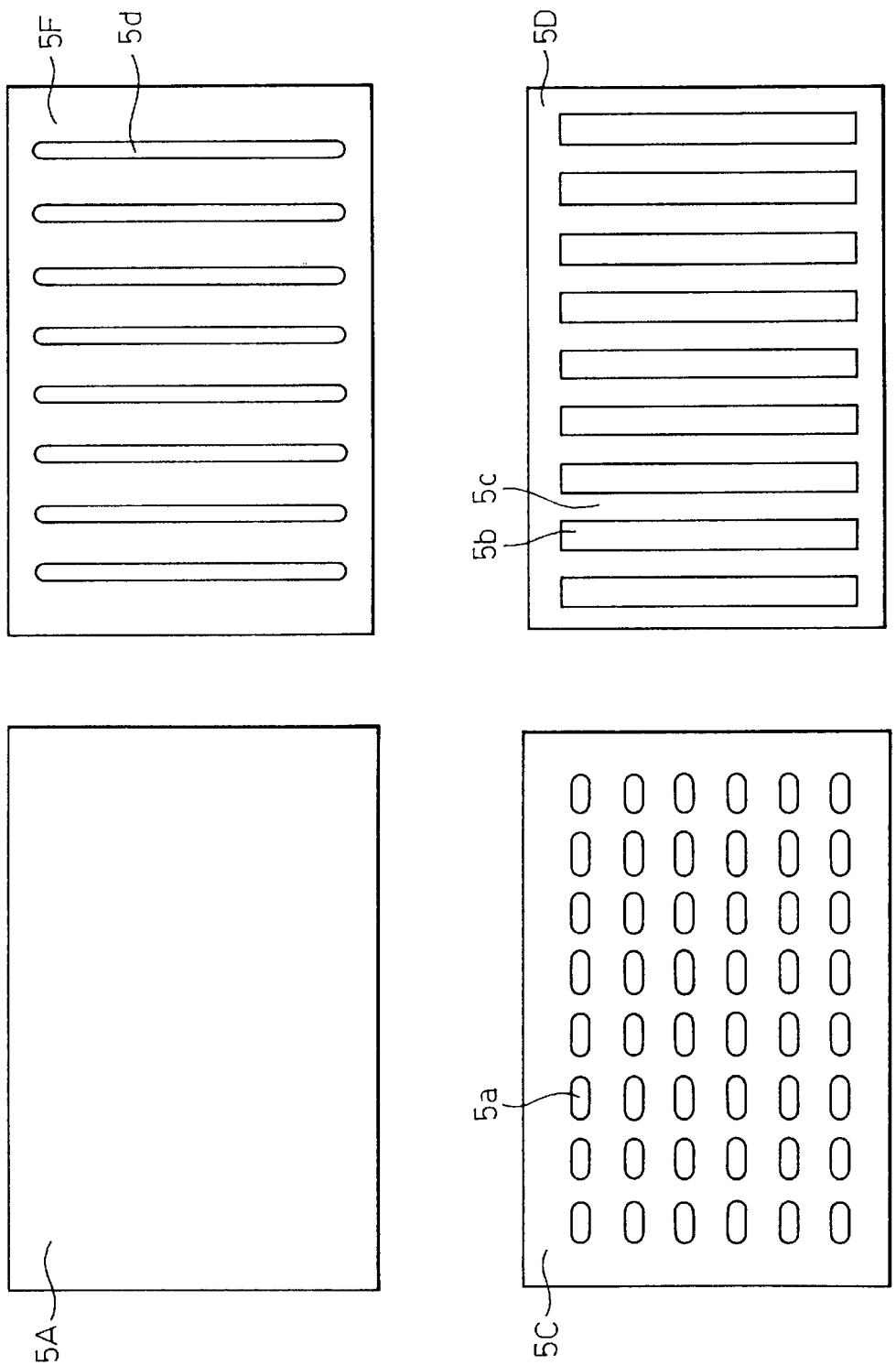

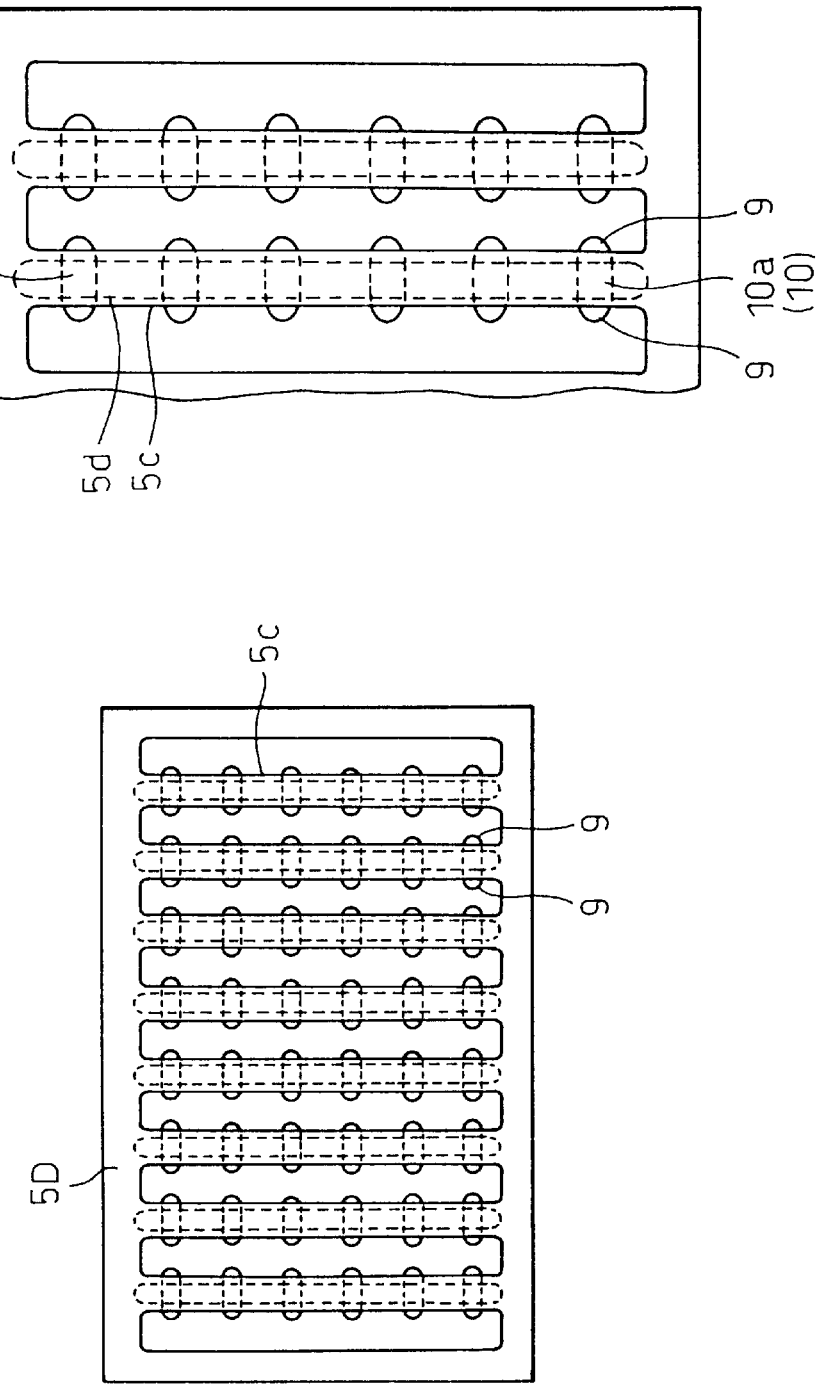

Fig.26
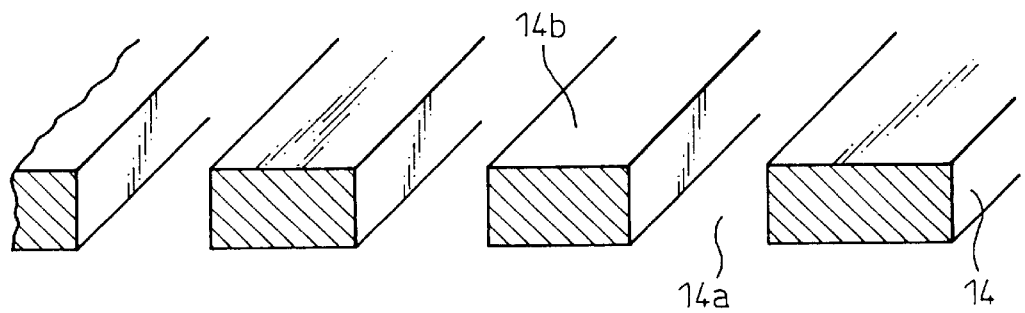
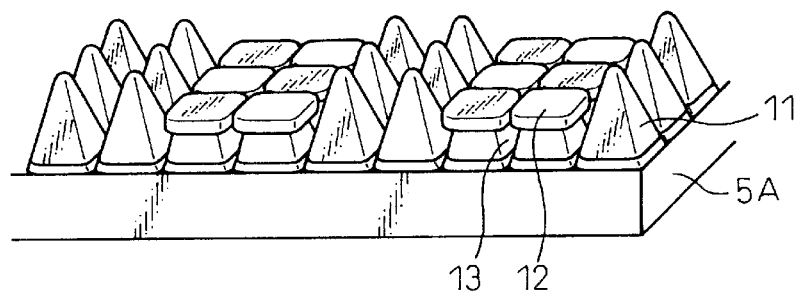
Fig.27
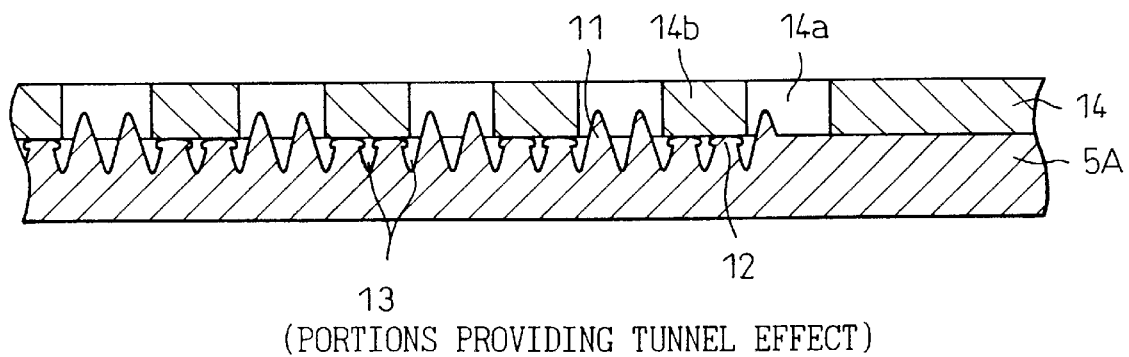
(PORTIONS PROVIDING TUNNEL EFFECT)

COOLING APPARATUS BOILING AND CONDENSING REFRIGERANT WITH IMPROVED TUNNEL STRUCTURE

BACKGROUND OF THE INVENTION

1. Field of the Invention

The present invention relates to a cooling apparatus boiling and condensing refrigerant that cools a heat-generating member by boiling heat transfer to a refrigerant.

2. Description of the Related Art

Presently there is a marked trend toward a higher density of heat generation and a higher temperature of heat flux in CPU chips for personal computers, devices for inverters, etc. that control large currents in vehicles, etc. due to the improvement of their performances. On the other hand, a cooling apparatus, which uses a boiling and condensing refrigerant, is suited to cool a heat-generating member that has a high density of heat generation because it can effectively remove heat from the heat-generating member by utilizing phenomena, of boiling and condensating a refrigerant, that has a high heat transfer rate.

The structure, however, of a cooling apparatus boiling and condensing refrigerant needs to be improved in order to cover an area where the density of heat generation of a heat-generating member exceeds 50 W/cm$^2$. In relation to this, it is widely known to prevent devices from being excessively heated by designing a tunnel structure in which a space that includes a boiling surface communicates with an outside space via communication openings whose opening area is small, and by providing a thin liquid film on the boiling surface.

In Japanese Unexamined Patent Publication (Kokai) No. 2001-116474, a cooling apparatus boiling and condensing refrigerant in which the above-mentioned tunnel structure is applied to a refrigerant tank has been disclosed. The refrigerant tank mentioned above, however, is formed of extruded materials, therefore, there are difficulties in manufacturing it actually. Moreover, even if such a tunnel structure can be realized, it has disadvantage in costs because of the necessity of cutting work.

SUMMARY OF THE INVENTION

The present invention has been developed with the above-mentioned circumstances taken into account and the objective is to provide a cooling apparatus boiling and condensing refrigerant that can realize high performance in a boiling section using a low-cost means.

The First Aspect of the Apparatus of the Present Invention

The cooling apparatus boiling and condensing refrigerant of the present invention comprises a refrigerant container that has a structure in which plural intermediate plates are stacked and both sides of the stacked intermediate plates, in the direction of stacking, are stacked by external plates, respectively.

The intermediate plates used in the refrigerant container include a first intermediate plate and a second intermediate plate that are stacked sequentially upon the external plate, and if the openings of the first intermediate plate are referred to as first openings and the openings of the second intermediate plate are referred to as second openings, then the first openings and the second openings communicate with each other and the opening dimension of the communicating sections is smaller than that of the first openings.

In this structure, it is possible to easily realize a tunnel structure only by designing the opening dimension or opening position of the first openings provided in the first intermediate plate and that of the second openings provided in the second intermediate plate.

The second aspect of the apparatus of the present invention

In the first aspect of the cooling apparatus boiling and condensing refrigerant, both the first openings and the second openings are formed into an elongate slit-shape, and provided so that the width of the slits of the first openings is wider than that of the second openings.

In this way, it is possible to make the opening dimension of the communicating sections, through which the first openings and the second openings communicate with each other, smaller than that of the first openings, and to realize a tunnel structure.

The third aspect of the apparatus of the present invention

In the first aspect of the cooling apparatus boiling and condensing refrigerant, the shapes of the first opening and the second opening are substantially similar to each other and the opening dimension of the first openings is larger than that of the second openings.

The first opening and the second opening may be formed, for example, into an elongate slit-shape as described in the second aspect of the apparatus of the present invention, but it is not necessary in particular to limit the opening shapes and they may be formed into circles, polygons, or the like. When, however, the opening shape is circular, polygonal or the like, it is possible to make without fail the opening dimension of the first openings larger than that of the second openings by designing the opening shapes so that they are substantially similar to each other.

The fourth aspect of the apparatus of the present invention

In the first aspect of the cooling apparatus boiling and condensing refrigerant, parts of the second openings communicate with the first openings so that the opening dimension of the communicating sections, through which the first openings and the second openings communicate with each other, has a fixed value.

In this structure, regardless of the opening dimension of the second opening, the opening dimension of the communicating sections can be kept to the fixed value because the parts of the second openings communicate with the first openings. In this case, as it is not necessary to strictly manage the opening dimension of the second openings, the second openings can be formed, for example, by press working. In other words, it is possible to form the openings in the communicating sections so that its dimension is further smaller without depending on the quality of the press molding of the second openings.

The fifth aspect of the Apparatus of the present invention

At least two second openings communicate with one of the first openings, in the first aspect of the cooling apparatus boiling and condensing refrigerant.

In this case, it is possible to form a tunnel structure the tunnel portion of which is long and achieve high performance in the boiling section at a low cost because at least two communicating sections, through which the second openings communicate with the first opening, are provided.

The sixth aspect of the apparatus of the present invention

The cooling apparatus boiling and condensing refrigerant of the present invention comprises a refrigerant container that has a structure in which plural intermediate plates are stacked and both sides of the stacked intermediate plates, in the direction of stacking, are stacked by external plates, respectively.

The intermediate plates used in the refrigerant container include a first intermediate plate and a second intermediate plate that are stacked sequentially upon the external plate, and if the openings of the first intermediate plate are referred to as first openings and the openings of the second intermediate plate are referred to as second openings, the first openings and the second openings communicate with each other and the opening dimension of the communicating sections is smaller than that of the first openings. Moreover, the first intermediate plate has communication paths through which the plural first openings communicate with each other.

In this structure, it is possible to easily realize a tunnel structure only by designing the opening dimension or opening position of the first openings provided in the first intermediate plate and that of the second openings provided in the second intermediate plate.

Moreover, as the plural communication paths through which the plural first openings communicate with each other (for example, one of the first openings and another one of the first openings) are provided in the first intermediate plate, even when evaporated bubbles pass continuously from one of the first openings through the communicating sections (communicating sections between the first openings and the second openings), a liquid refrigerant can enter the one of the first openings from the other one of the first openings via the communication path. In this way, it is possible to prevent the liquid refrigerant from being exhausted within the first openings and a sufficient cooling performance can be maintained.

The seventh aspect of the apparatus of the present invention

The communication path provided in the first intermediate plate enables the communication between a first opening (one of the first openings) within which a refrigerant is in a state of boiling and another first opening (another one of the first openings) within which a refrigerant is not in a state of boiling, in the sixth aspect of the cooling apparatus boiling and condensing refrigerant.

In this case, as a liquid refrigerant is supplied to the one of the first openings from the other first opening via the communication path, the liquid refrigerant can be prevented from being exhausted in the one of the first openings within which the refrigerant is in a state of boiling.

The eighth aspect of the apparatus of the present invention

The cooling apparatus boiling and condensing refrigerant of the present invention comprises a refrigerant container that has a structure in which plural intermediate plates are stacked and both sides of the stacked intermediate plate, in the direction of stacking, are stacked by external plates, respectively.

The intermediate plates used in the refrigerant container include a third intermediate plate, a first intermediate plate and a second intermediate plate that are stacked sequentially upon the external plate, and if the openings provided in the first intermediate plate are referred to as first openings, the openings provided in the second intermediate plate are referred to as second openings, and the openings provided in the third intermediate plate are referred to as third openings, then the first openings and the second openings communicate with each other and the opening dimension of the communicating sections is smaller than that of the first openings. Moreover, the third openings are provided as communication paths through which the plural first openings communicate with each other.

In this structure, it is possible to easily realize a tunnel structure only by designing the opening dimension or opening position of the first openings provided in the first intermediate plate and that of the second openings provided in the second intermediate plate.

Moreover, as the third openings (communication paths) through which the plural first openings communicate with each other (for example, one of the first openings and another one of the first openings) are provided in the third intermediate plate, even when evaporated bubbles pass continuously from one of the first openings through the communicating sections (communicating sections between the first openings and the second openings), a liquid refrigerant can enter the one of the first openings from the other one of the first openings via the communicating path. In this way, it is possible to prevent the liquid refrigerant from being exhausted within the first openings and a sufficient cooling performance can be maintained.

The ninth aspect of the apparatus of the present invention

The third openings provided in the third intermediate plate enable the communication between first openings within which a refrigerant is in a state of boiling and other first openings within which a refrigerant is not in a state of boiling, in the eighth aspect of the cooling apparatus boiling and condensing refrigerant.

In this case, as a liquid refrigerant is supplied to the one of the first openings from other first opening via the third opening (communication path) provided in the third intermediate plate, the liquid refrigerant can be prevented from being exhausted in the one of the first openings within which the refrigerant is in a state of boiling.

The tenth aspect of the apparatus of the present invention

A cooling apparatus boiling and condensing refrigerant comprises a refrigerant container forms a closed space, in which a refrigerant is stored, together with a plate to the surface of which a heat-generating member is attached; wherein a heat-generating member, from which the refrigerant stored in the refrigerant container receives heat and is evaporated into vapor, is cooled by releasing the latent heat of the refrigerant vapor to the outside; and wherein a tunnel structure is provided on the inner surface of the plate by press working.

In this case, cutting work that requires time and cost can be obviated and it is possible to easily form a tunnel structure (bag-shaped) by press working at a low cost.

The eleventh aspect of the apparatus of the present invention

The tunnel structure is composed of plural pillar portions that are perpendicular to the inner surface of the plate and cap portions formed by enlarging the tops of the pillar portions in the horizontal direction, in the tenth aspect of the cooling apparatus boiling and condensing refrigerant.

In this structure, cavity portions can be formed between neighboring pillar portions and a bag-shaped tunnel structure can be formed by covering the upper portions of the cavity portions by the cap portions.

The twelfth aspect of the method of the present invention

A method of forming the tunnel structure on the inner surface of the plate in the cooling apparatus boiling and condensing refrigerant in the eleventh aspect, comprises a first press process in which plural pillar portions are press-worked into pyramids or cones on the inner surface of the plate and a second press process in which the cap portions are formed by pressing down the tops of the pillar portions, which are pyramid-shaped or cone-shaped, to a fixed height and enlarging them in the horizontal direction.

With this manufacturing method, a tunnel structure (bag-shaped) can be formed easily in a brief time only by applying the press working twice to the inner surface of the plate.

Moreover, as the cap portions are formed by pressing down the tops of the pillar portions to the fixed height in the second press process, the height of the cap portions can be made low and it is possible, as a result, to design a refrigerant container the height of which is low.

The thirteenth aspect of the apparatus and method of the present invention

The refrigerant container has a multilayer structure in which plural plane plates are stacked upon the plate, in the cooling apparatus boiling and condensing refrigerant in any one of the tenth to the twelfth aspects.

In this structure, the volume (inner volume) of the refrigerant container can be altered easily according to the increase/decrease in heat load because the inner volume of the refrigerant container can be altered by increasing/decreasing the number of the plane plates.

The present invention may be more fully understood from the description of the preferred embodiments of the invention set forth below, together with the accompanying drawings.

BRIEF DESCRIPTION OF THE DRAWINGS

In the drawings:

FIG. 5 shows plan views of plates (a heat receiving plate, a first intermediate plate and a second intermediate plate) that make up a refrigerant container (a second embodiment).

FIG. 6 is a plan view of a state in which the first intermediate plate and the second intermediate plate are stacked (the second embodiment).

FIG. 7 shows plan views of plates (a heat receiving plate, a first intermediate plate and a second intermediate plate) that make up a refrigerant container (a third embodiment).

FIG. 8 is a sectional view of a boiling section of the refrigerant container (the third embodiment).

FIG. 12A is a plan view of a state in which the first intermediate plate and the second intermediate plate are stacked (the fifth embodiment).

FIG. 12B is a partially enlarged view of FIG. 12A.

FIG. 15 shows plan views of plates (a heat receiving plate, a first intermediate plate and a second intermediate plate) that make up a refrigerant container (a sixth embodiment).

FIG. 16A is a plan view of a state in which the first intermediate plate and the second intermediate plate are stacked (the sixth embodiment).

FIG. 16B is a partially enlarged view of FIG. 16A.

FIG. 20 shows plan views of plates (a heat receiving plate, a first intermediate plate, a second intermediate plate and a third intermediate plate) that make up a refrigerant container (a seventh embodiment).

FIG. 21A is a plan view of a state in which the plates (the third intermediate plate, the first intermediate plate and the second intermediate plate) are stacked (the seventh embodiment).

FIG. 21B is a partially enlarged view of FIG. 21A.

FIG. 26 shows perspective views of a heat receiving plate and another plate (a ninth embodiment).

FIG. 27 is a sectional view that shows a state in which the heat receiving plate and the other plate are stacked (the ninth embodiment).

DESCRIPTION OF THE PREFERRED EMBODIMENTS

The preferred embodiments of the present invention will be described below with reference to drawings.

First Embodiment

Figure 1:
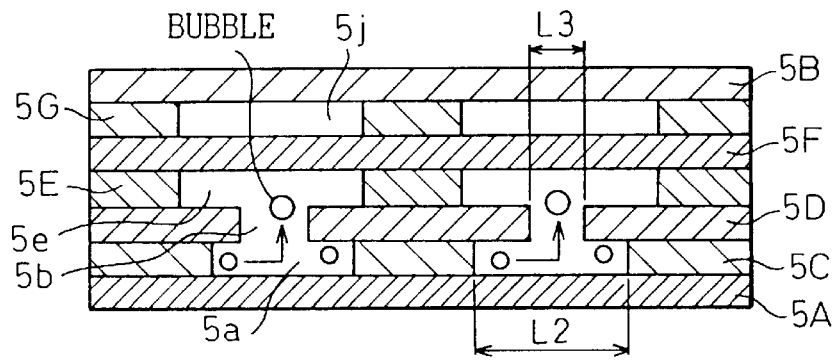
FIG. 1 is a sectional view of a boiling section of a refrigerant container (a first embodiment).
Figure 2:
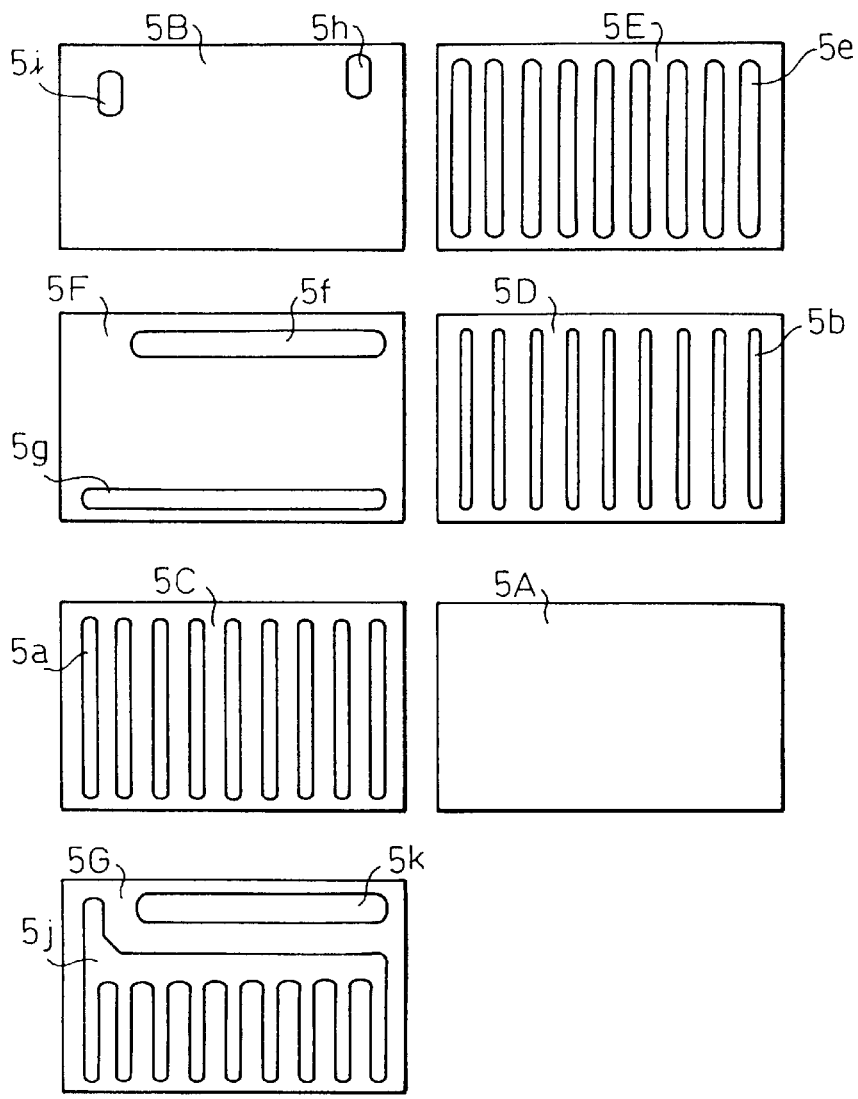
FIG. 2 shows plan views of plates (a heat receiving plate, a first intermediate plate and a second intermediate plate) that make up the refrigerant container (the first embodiment).

FIG. 1 is a sectional view of a boiling section of a refrigerant container and FIG. 2 shows plan views of plates that make up the refrigerant container.

Figure 3:
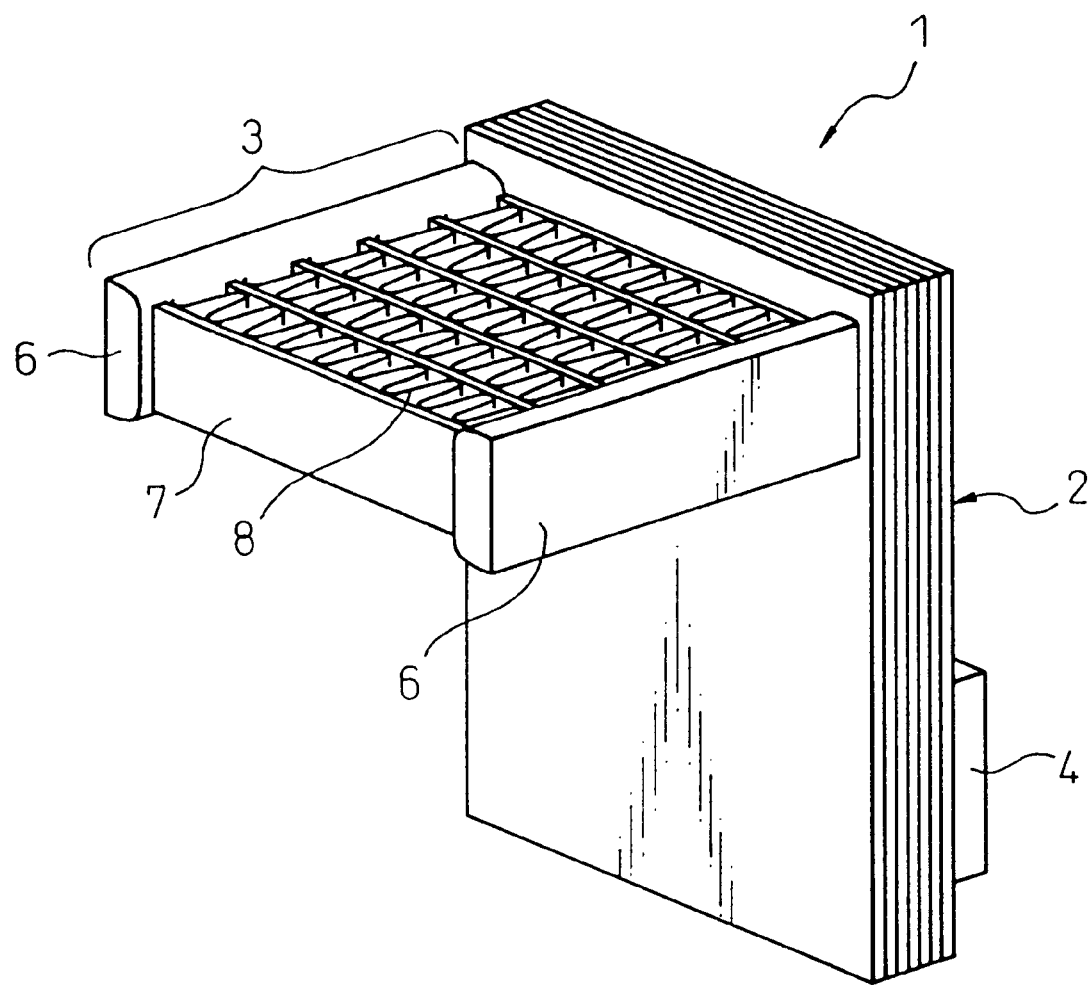
FIG. 3 is a perspective view of a cooling apparatus boiling and condensing refrigerant.

A cooling apparatus boiling and condensing refrigerant in the present embodiment comprises a refrigerant container 2, within the inner space of which a refrigerant is stored and a heat radiating section 3 attached to the refrigerant container 2, and a heat-generating member 4 is secured by tighting screws, etc., to a surface of the refrigerant container 2, as shown in FIG. 3 and FIG. 4.

Figure 4A:
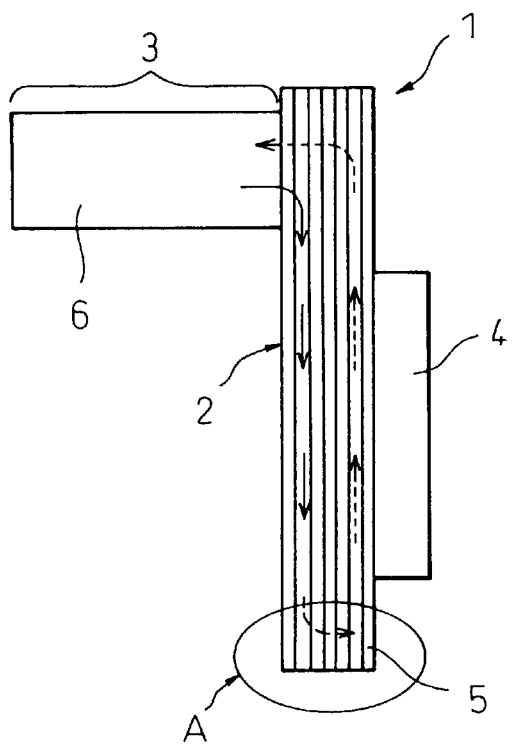
FIG. 4A is a side view of the cooling apparatus boiling and condensing refrigerant.
Figure 4B:
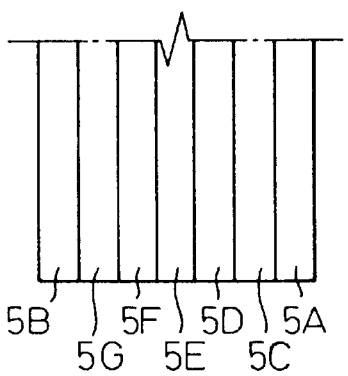
FIG. 4B is an enlarged view of part A in FIG. 4A.

The refrigerant container 2 comprises plural plates 5 stacked as shown in FIG. 4A and FIG. 4B.

The plural plates 5 are pressed materials punched out by a press die from, for example, aluminum plates or stainless plates, etc., and comprise two external plates 5A and 5B arranged on both sides of the refrigerant container 2 and, for example, five intermediate plates 5C, 5D, 5E, 5F and 5G stacked between the two external plates 5A and 5B.

One of the two external plates 5A and 5B is referred to as a heat receiving plate 5A to the surface of which the heat-generating member 4 is attached, and the other external plate is referred to as a heat radiating plate 5B to the surface of which the heat radiating section 3 is attached, and a set of communication holes (5h, 5i), into which headers 6 (refer to FIG. 3) of the heat radiating section 3 are inserted, are formed in the heat radiating plate 5B.

Plural slit-shaped openings (refer to FIG. 1) are provided with the same pitch in the intermediate plates 5C to 5E, and the openings in one of the intermediate plates 5C to 5E communicate with the openings in other intermediate plates, forming the inner space within the refrigerant container 2.

There exists, however, a difference in the opening dimension (slit width) of the openings between the intermediate plate (referred to as a first intermediate plate 5C) adjacent to the heat receiving plate 5A and the intermediate plate (referred to as a second intermediate plate 5D) adjacent to the first intermediate plate 5C, as shown in FIG. 2, and the slit width of the openings (referred to as first openings 5a) of the first intermediate plate 5C is wider than that of the openings (referred to as second openings 5b) of the second intermediate plate 5D.

In this way, a tunnel structure is formed as shown in FIG. 1, in which an opening dimension L3 (i.e. the opening dimension of the second openings 5b) of the communication sections (tunnel openings) through which the first openings 5a and the second openings 5b communicate is smaller than a length L2 of the tunnel portions (i.e. the opening dimension of the first openings 5a), that is, L2>L3, which is shown in a cross sectional view in which the first intermediate plate 5C and the second intermediate plate 5D are stacked.

In the upper portion of the intermediate plate 5F stacked upon the intermediate plate 5E, an opening 5f that communicates with an opening 5e is formed, and in the lower portion of the intermediate plate 5F, an opening 5g that communicates with the lower portion of the opening 5e is formed, respectively. Moreover, an almost comb-shaped opening 5j, which communicates with an opening 5k and into which a refrigerant passing through the heat radiating section 3 flows, is formed in the intermediate plate 5G.

As shown in FIG. 3, the heat radiating section 3 comprises the two headers 6, plural tubes 7 through which the two headers 6 communicate, and heat radiating fins 8 attached to the surface of each tube 7 so as to be in contact with it.

The two headers 6 are inserted into the communication holes provided in the heat radiating plate 5B assembled so that two headers 6 communicate with the inner space of the refrigerant container 2.

The tubes 7 are attached to the two headers 6 almost in parallel (or slightly inclined) to the surface of the heat radiating plate 5B and communicate with the inner space within the refrigerant container 2 via the two headers 6.

Next the operations of the cooling apparatus boiling and condensing refrigerant 1 that has the above-mentioned structure will be described.

The refrigerant stored in the inner space of the refrigerant container 2 receives heat from the heat-generating member 4 and is evaporated into vapor. The evaporated vapor refrigerant passes through the openings 5a, 5b and 5e in the intermediate plates 5C to 5E and is collected temporarily in the opening 5f. The refrigerant that has passed through the openings 5f and 5k flows into one of the headers 6 via the opening 5h. Then, it is cooled by the cooling airflow sent to the heat radiating section 3 while flowing from the one of the headers 6 into each tube 7 distributively.

At this time, the refrigerant radiates the latent heat of condensation, turns into condensate and circulates to the refrigerant container 2 via the opening 5i from the other header 6. The refrigerant that has flowed into the refrigerant container 2 is distributed in the opening 5j and after being collected temporarily in the opening 5g, it is distributed again to the openings 5e, 5b and 5a. In this way, by means of the heat transfer of the boiling refrigerant, the heat of the heat-generating member 4 is radiated to the outside air from the heat radiating section 3 and the heat-generating member 4 is cooled.

Effects of the First Embodiment

In the refrigerant container 2 in the present embodiment, it is possible to form the tunnel structure (L2>L3) as shown in FIG. 1 using the first opening 5a provided in the first intermediate plate 5C and the second opening 5b provided in the second intermediate plate 5D. Due to this structure, it is also possible to effectively cool the heat-generating member 4 that has a large density of heat generation because the number of bubble forming points at which the refrigerant boils is increased and the boiling heat transfer is promoted by the formation of the thin liquid film.

Moreover, as the first intermediate plate 5C and the second intermediate plate 5D are made of press materials, it is possible to realize a tunnel structure at a low cost without the necessity of work such as cutting.

Second Embodiment

FIG. 5 shows plan views of the plates 5A, 5C and 5D.

The present embodiment is an example case in which the shapes of the openings provided in the first intermediate plate 5C and the second intermediate plate 5D are made substantially similar and may be, for example, circles (or polygons such as triangles or quadrilaterals) as shown in FIG. 5.

In this case also, the opening width (diameter of the opening) of the first opening 5a in the first intermediate plate 5C is wider than that of the second opening 5b in the second intermediate plate 5D, and if both the intermediate plates 5C and 5D are stacked, the first opening 5a and the second opening 5b are arranged concentrically as shown in FIG. 6, a tunnel structure (refer to FIG. 1) can be formed, and the same effects as those in the first embodiment can be obtained.

Third Embodiment

FIG. 7 shows plan views of the plates 5A, 5C and 5D.

The present embodiment is an example case in which a large first opening 5a in the first intermediate plate 5C is provided so as to occupy substantially all the surface of the plate, as shown in FIG. 7.

In this case, if the first intermediate plate 5C and the second intermediate plate 5D are stacked, the length L2 of the tunnel portion becomes equal to the dimension L1 (dimension between the neighboring second openings 5b) of the metal portion 5c of the second intermediate plate 5D, as shown in FIG. 8. If, therefore, the dimension L1 of the metal portion 5c is designed so as to be large, a tunnel structure the length of the tunnel portion of which is long can be formed and higher performance can be achieved because the formation of the thin liquid film on the boiling surface is promoted.

Fourth Embodiment

Figure 9:
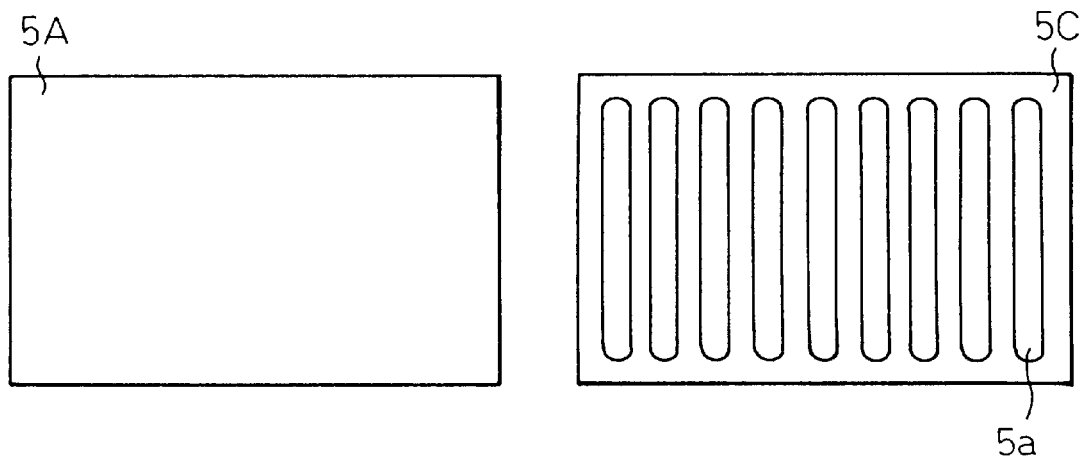
FIG. 9 shows plan views of plates (a heat receiving plate, a first intermediate plate and a second intermediate plate) that make up a refrigerant container (a fourth embodiment).

FIG. 9 shows plan views of the plates 5A, 5C and 5D.

The present embodiment is an example case in which first openings 5a in the first intermediate plate 5C are formed so as to be elongate slit-shaped, and the opening dimension of the second openings 5b to be provided in the second intermediate plate 5D are made smaller than the opening dimension of the first openings 5a in the longitudinal direction (in the vertical direction in FIG. 9), as shown in FIG. 9.

Figure 10:
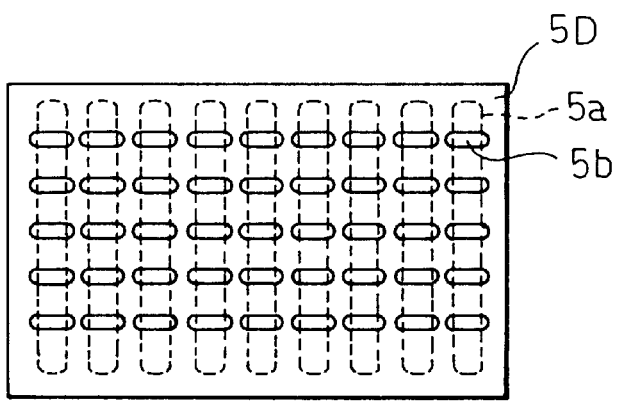
FIG. 10 is a plan view of a state in which the first intermediate plate and the second intermediate plate are stacked (the fourth embodiment).

In this case, if the first intermediate plate 5C and the second intermediate plate 5D are stacked, the plural second openings 5b communicate with the first openings 5a in the longitudinal direction, as shown in FIG. 10. Because of this, it is found that a tunnel structure, the length L2 of the tunnel portion of which is long, can be formed when the sectional view of the first opening 5a in the longitudinal direction is viewed as shown in FIG. 8, therefore higher performance can be achieved because the formation of the thin liquid film on the boiling surface is promoted, in the same manner as in the third embodiment.

Fifth Embodiment

Figure 11:
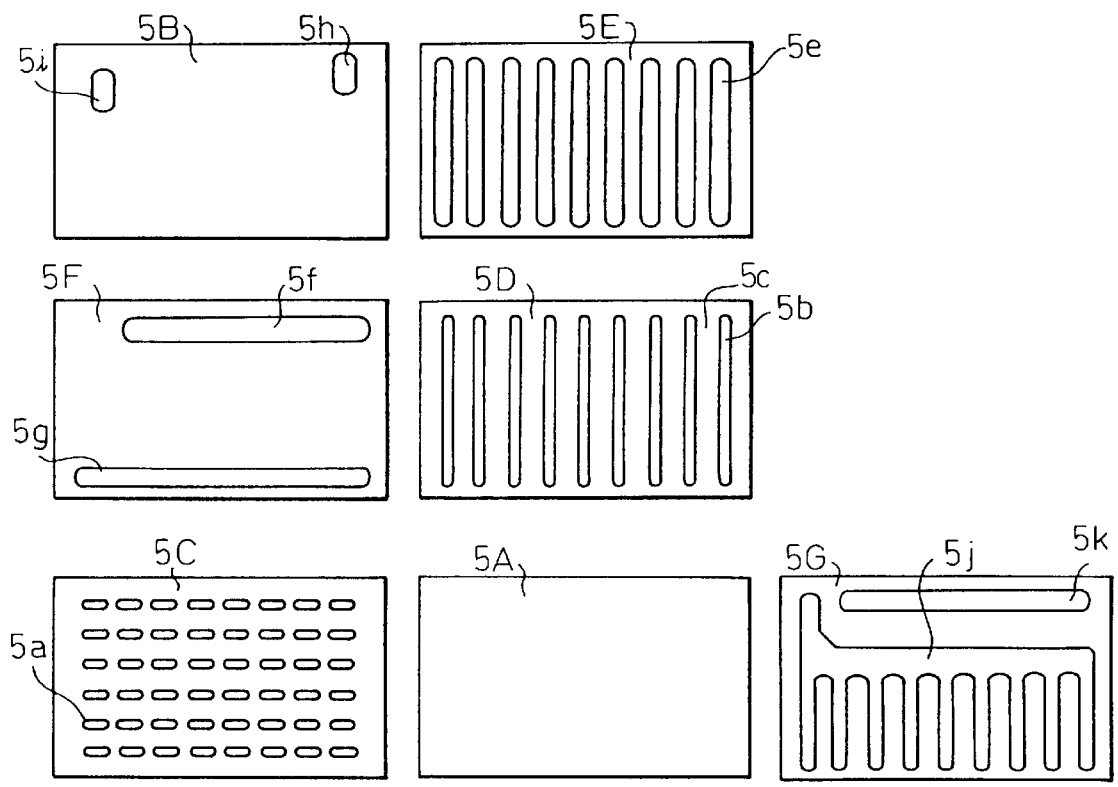
FIG. 11 shows plan views of plates (a heat receiving plate, a first intermediate plate and a second intermediate plate) that make up a refrigerant container (a fifth embodiment).

FIG. 11 shows plan views of the plates 5A to 5G.

The present embodiment is an example case in which parts of the second openings 5b communicate with the first openings 5a so that the opening dimension of a tunnel openings 9 (refer to FIG. 12), through which both the first openings 5a in the first intermediate plate 5C and the second openings 5b in the second intermediate plate 5D communicate, becomes a fixed value.

Figure 13:
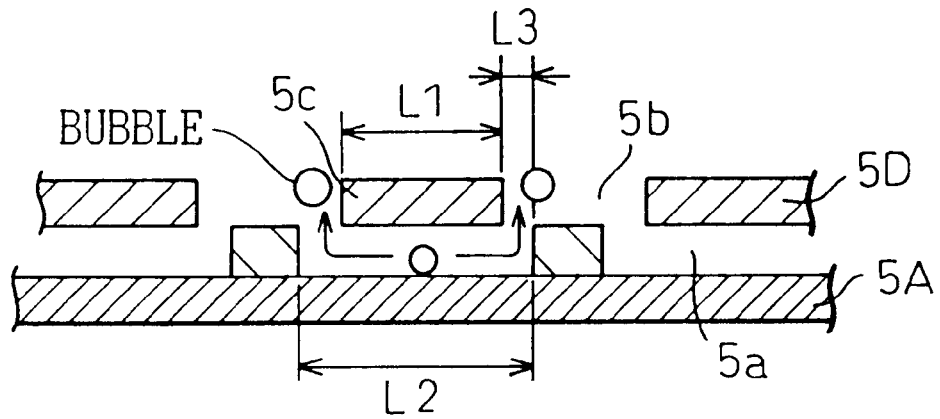
FIG. 13 is a sectional view of a boiling section of the refrigerant container (the fifth embodiment).

Generally, when a reentrant effect in the boiling section is aimed at, it is important to manage the length L2 of the tunnel portion (the first opening 5a) and the opening dimension L3 of the tunnel openings 9 (refer to FIG. 13). Although the optimum dimension of L3 depends on the refrigerant to be used and various conditions such as the shape of the boiling section, it is thought to be around 0.1 mm, approximately.

On the other hand, it is natural that the opening dimension L3 of the tunnel openings 9 is equal to the opening dimension of the second openings 5b in the second intermediate plate 5D in the above-mentioned first to fourth embodiments. This means that the opening dimension L3 of the tunnel openings 9 depends on the quality of the press molding of the second intermediate plate 5D, and it is necessary to press and mold an opening that has, for example, the optimum dimension of 0.1 mm. It is, however, thought difficult to press and mold an opening of around 0.1 mm diameter using the current press molding technology.

If the opening dimension of the first openings 5a (length L2 of the tunnel portion) is formed so as to be somewhat larger than the dimension L1 of the metal portion 5c of the second intermediate plate 5D, substantially all the part of the first opening 5a is covered by the metal portion 5c of the second intermediate plate 5D, so that parts of the first openings 5a communicate with the second openings 5b, when the first intermediate plate 5C and the second intermediate plate 5D are stacked, as shown in FIG. 12A and FIG. 12B.

Figure 14:
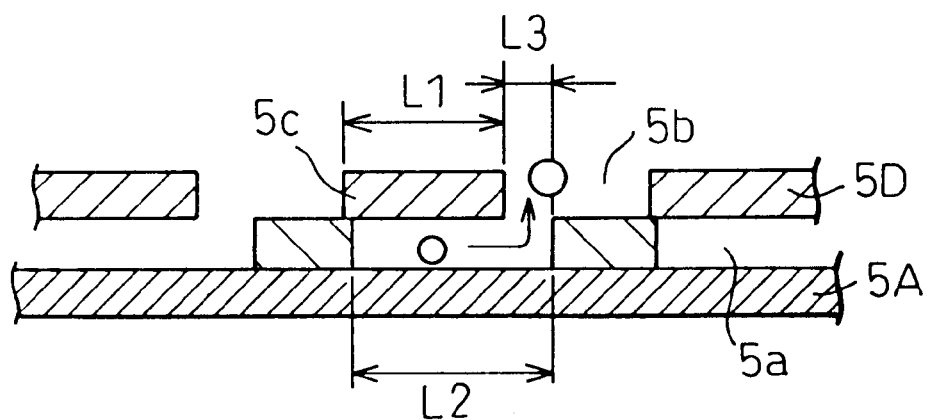
FIG. 14 is a sectional view of a boiling section of the refrigerant container (the fifth embodiment).

As shown in FIG. 13 or FIG. 14, therefore, by forming the opening dimension L2 of the first opening 5a so as to be longer than the dimension L1 of the metal portion 5c of the second intermediate plate 5D by the amount of the above-mentioned optimum dimension, that is, approximately 0.1 mm, it is possible to form the opening dimension L3 of the tunnel openings 9 within a desired level without depending on the quality of the press molding. As a result, higher performance of the boiling section can be achieved at a low cost.

Sixth Embodiment

FIG. 15 shows plan views of the plates 5A, 5C and 5D.

The present embodiment is an example case in which communication paths 5d, through which the first openings 5a in the first intermediate plate 5C communicate with each other, are provided, for example, in the first intermediate plate 5C, as shown in the fifth embodiment.

In the first intermediate plate 5C, the plural first openings 5a are formed at fixed intervals in the horizontal and vertical directions of the plate, respectively, similar to the fifth embodiment, and the communication paths 5d through which the first openings 5a, which are arranged in the vertical direction of the plate, communicate with each other are provided (refer to FIG. 15).

Figure 17:
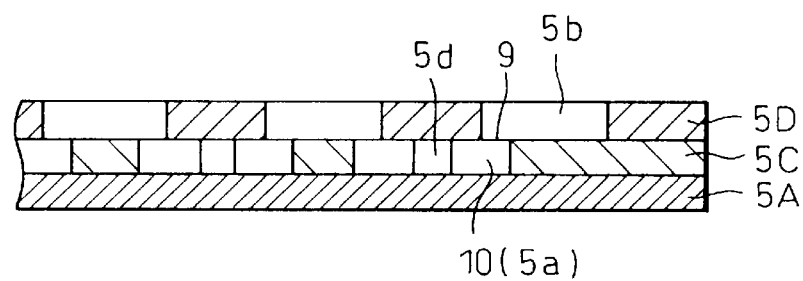
FIG. 17 is a sectional view of a boiling section of the refrigerant container (the sixth embodiment).

When the first intermediate plate 5C and the second intermediate plate 5D are stacked, the upper part in the center of the first opening 5a is covered by the metal portion 5c of the second intermediate plate 5D, so that a tunnel portion 10 is formed and the tunnel openings 9 (communicating sections of the present invention) are formed as both the left and right sides of the first opening 5a, that are not covered by the metal portion 5c, communicate with the second opening 5b, as shown in FIG. 16 and FIG. 17.

If the communication paths 5d are not provided in the first intermediate plate 5C (the first intermediate plate 5C shown in the fifth embodiment), the liquid refrigerant stored in the first openings 5a receives heat from the heat-generating member 4 and boils and, when the generated bubbles flow from the first openings 5a into the second openings 5b via the tunnel openings 9, if the grown bubbles pass through the tunnel openings 9 continuously, the liquid refrigerant cannot enter the tunnel portions 10 during this period, and the performance of the boiling section may be degraded because the thin liquid film is exhausted.

Figure 18:
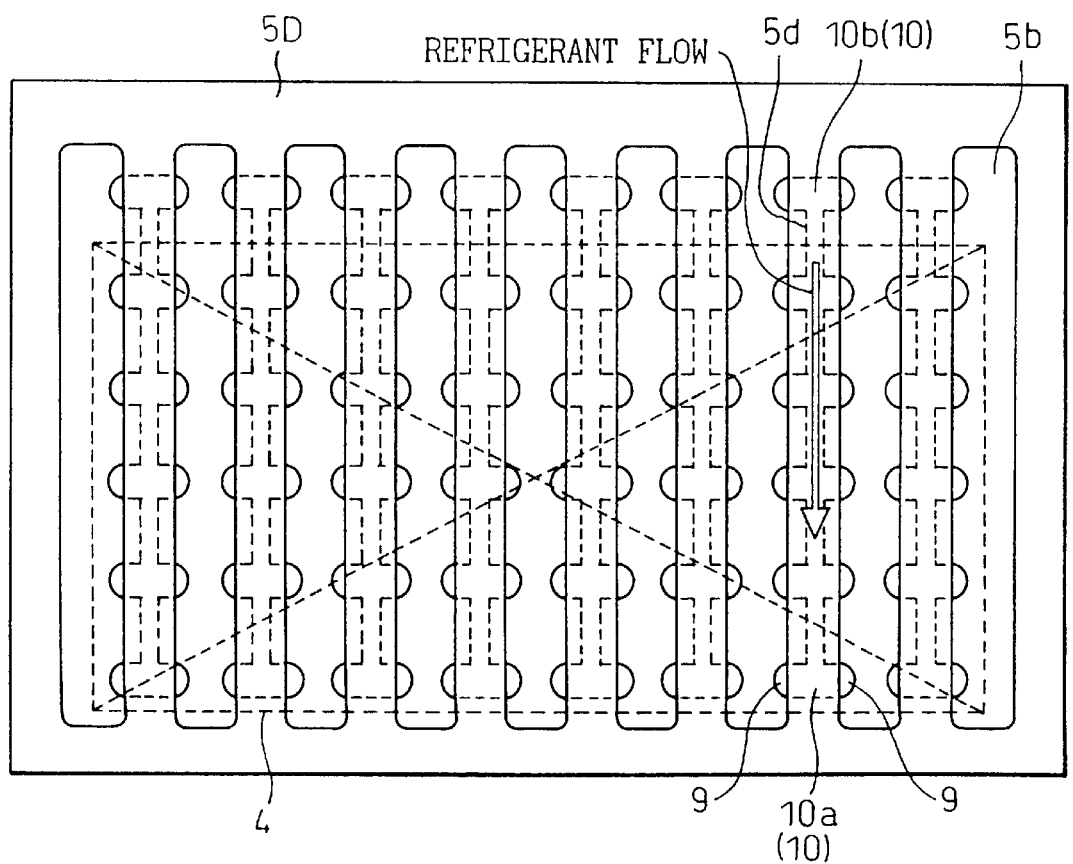
FIG. 18 is a plan view of the boiling section viewed from the top of the second intermediate plate (the sixth embodiment).

Contrary to this, as the tunnel portion 10a provided within the mounting area of the heat-generating member 4 and the tunnel portions 10b provided outside the mounting area of the heat-generating member 4 communicate with each other through the communication paths 5d in the present embodiment, as shown in FIG. 18, even when the refrigerant (bubble) evaporated in the tunnel portions 10a passes through the tunnel openings 9 continuously, the liquid refrigerant can flow from the tunnel portions 10b, that are not in a state of boiling, into the tunnel portions 10a, that are in a state of boiling, via the communication paths 5d. As a result, the refrigerant can be prevented from being exhausted in the tunnel portions 10a in a state of boiling and the degradation of the performance of the boiling section can be prevented because the thin liquid film can be always formed on the boiling surface of the first intermediate plate 5C.

On the other hand, there is an optimum dimension for the size of the first opening 5a that forms a tunnel portion 10. For example, when Freon (FC72, HFC134a) refrigerant is used, it is confirmed that the best cooling performance can be achieved when the equivalent diameter is around 0.3 mm.

Figure 19A:
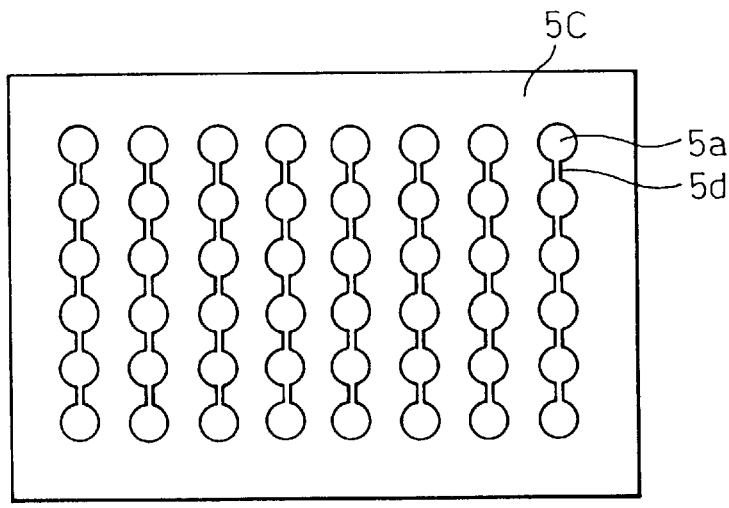
FIG. 19A is a plan view that shows a variant of the first intermediate plate (the sixth embodiment).
Figure 19B:
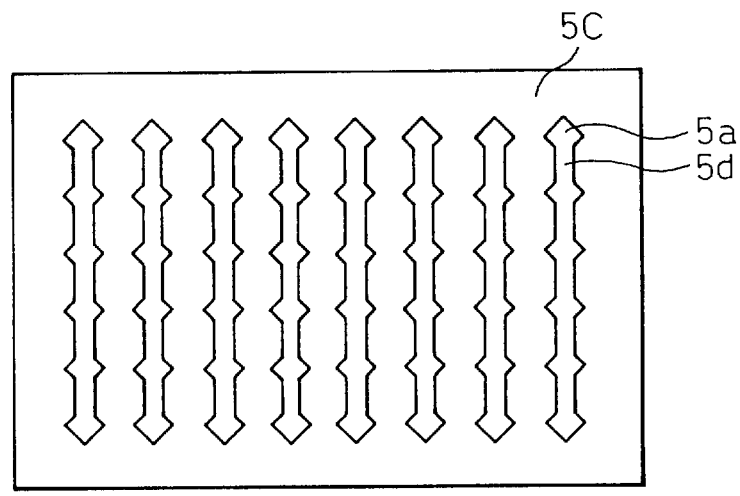
FIG. 19B is a plan view that shows another variant of the first intermediate plate (the sixth embodiment).
Figure 19C:
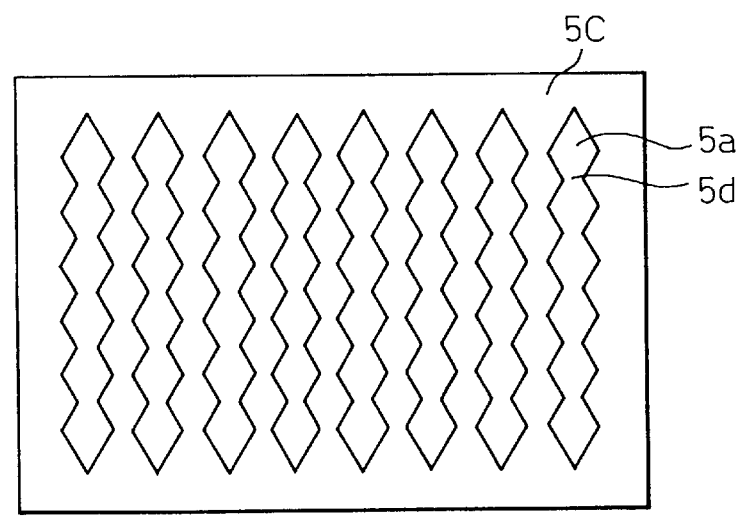
FIG. 19C is a plan view that shows another variant of the first intermediate plate (the sixth embodiment).
Figure 22:
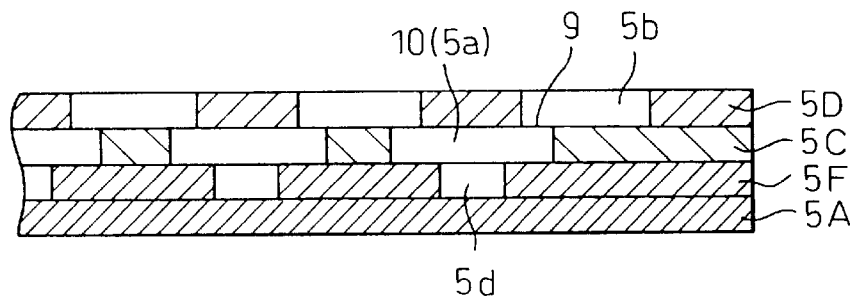
FIG. 22 is a sectional view of a boiling section of the refrigerant container (the seventh embodiment).

Moreover, the pressed shapes of the first intermediate plate 5C (the opening patterns of the first openings 5a and the communication paths 5d) are not limited to those in the present embodiment (refer to FIG. 15), and there can be, for example, other shapes as shown in FIG. 19A to FIG. 19C.

Seventh Embodiment

FIG. 20 shows plan views of the plates 5A, 5C, 5D and 5F.

The present embodiment is an example case in which the third intermediate plate 5F is arranged between the heat receiving plate 5A and the first intermediate plate 5C and, in the third intermediate plate 5F, the communication paths 5d (the third openings) through which the plural first openings 5a provided in the first intermediate plate 5c communicate with each other are provided.

If the third intermediate plate 5F, the first intermediate plate 5C and the second intermediate plate 5D are stacked upon the heat receiving plate 5A in this order, the upper parts of the first openings 5a are covered by the metal portion 5c of the second intermediate plate 5D and the tunnel portion 10 is formed, and both the left and the right sides of the first openings 5a communicate with the second openings 5b, resulting in the formation of the tunnel openings 9 (the communication portions of the present invention). Moreover, the plural first openings 5a provided in the longitudinal direction of the first intermediate plat 5C communicate with each other through the communication paths 5d in the third intermediate plate 5F.

Figure 23:
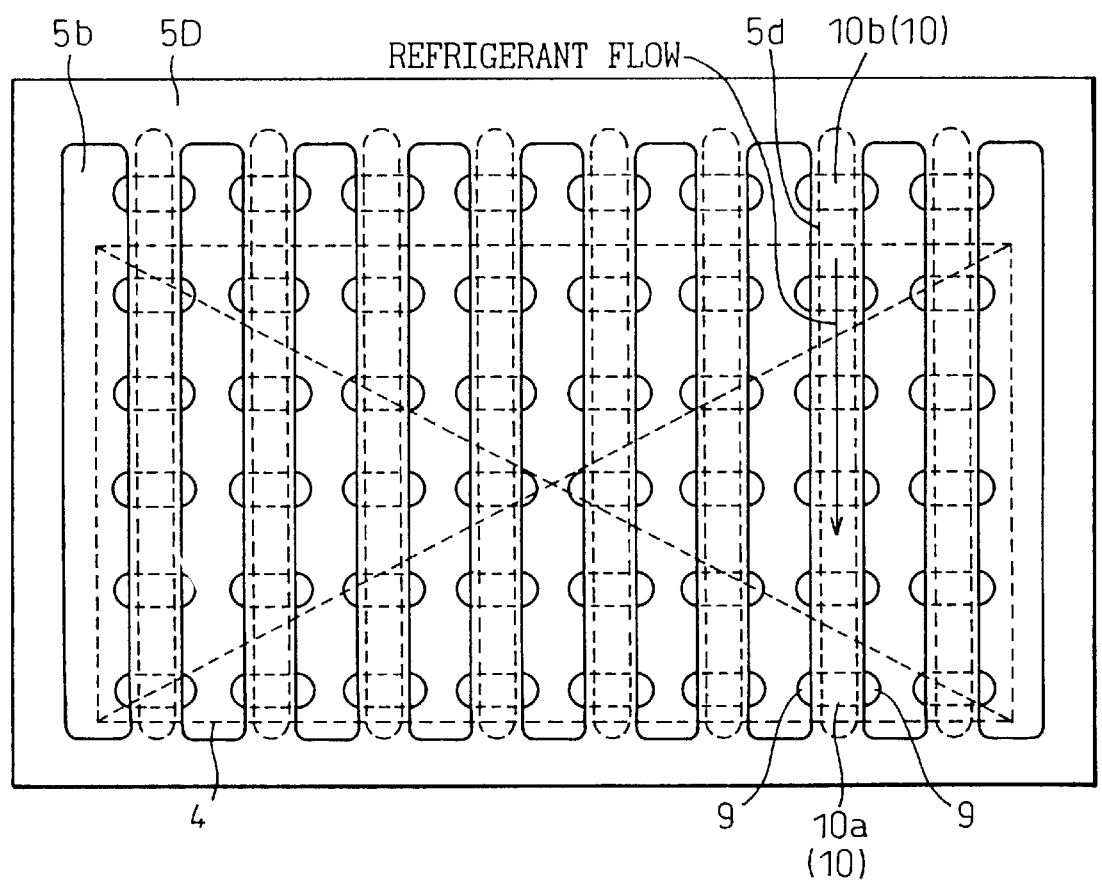
FIG. 23 is a plan view of the boiling section viewed from the top of the second intermediate plate (the seventh embodiment).

In this structure also, similar to the sixth embodiment, even when the refrigerant (bubble) evaporated within the tunnel portions 10a provided within the mounting area of the heat-generating member 4 passes through the tunnel openings 9 continuously, the liquid refrigerant can flow from the tunnel portions 10b provided outside the mounting area of the heat-generating member 4 to the tunnel portions 10a in a state of boiling through the communication paths 5d (refer to FIG. 23). As a result, the refrigerant can be prevented from being exhausted in the tunnel portions 10a in a state of boiling and the degradation of the performance of the boiling section can be prevented because the liquid film can always be formed on the boiling surface of the first intermediate plate 5C.

Eighth Embodiment

Figure 24:
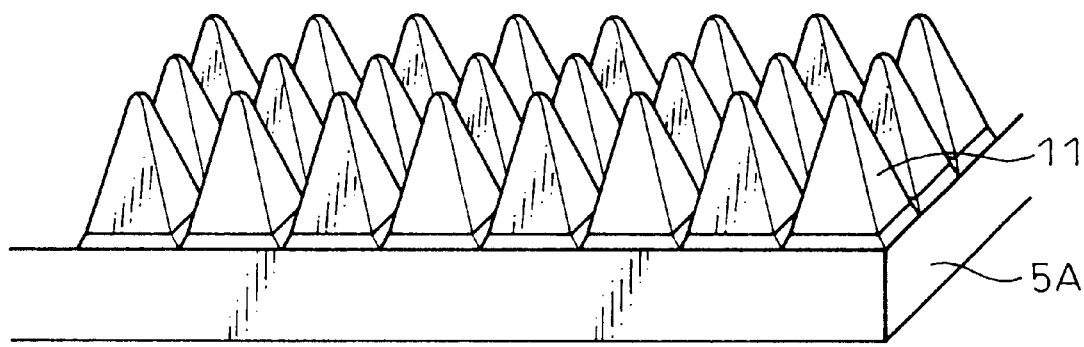
FIG. 24 is a perspective view of a heat receiving plate to which a first press process has been performed (an eighth embodiment).
Figure 25:
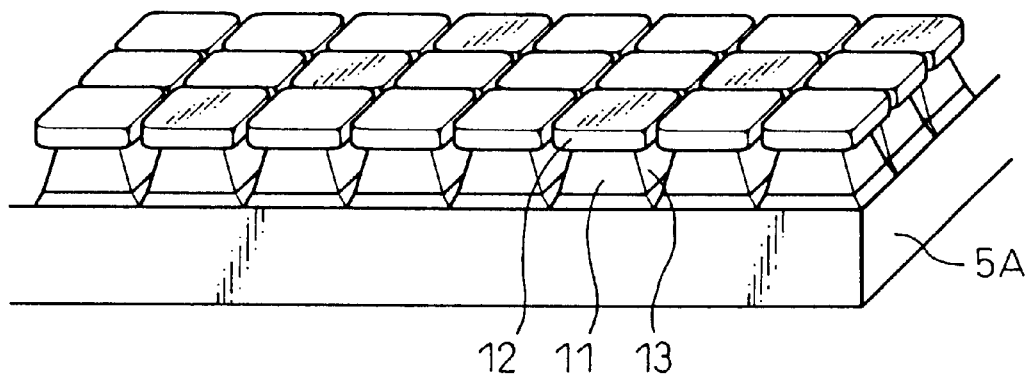
FIG. 25 is a perspective view of the heat receiving plate to which a second press process has been performed (the eighth embodiment).

FIG. 24 is a perspective view of the heat receiving plate 5A to which the first press process has been performed and FIG. 25 is a perspective view of the heat receiving plate 5A to which the second press process has been performed.

The present embodiment is an example case in which a tunnel structure (bag-shaped) is provided on the inner surface (boiling surface) of the heat receiving plate 5A (external plate) to which a heat-generating member (not shown) is attached, and the tunnel structure is formed by the press working (the first press process and the second press process).

A refrigerant container (not shown) formed using the heat receiving plate 5A may have a multilayer structure in which plural plates (plane member) are stacked upon the heat receiving plate 5A, similar to the first to the seventh embodiments, or may be a box-shaped container composed of the heat receiving plate 5A.

First Press Process

A press die is pressed against the inner surface of the heat receiving plate 5A and plural pyramid-shaped (or cone-shaped) pillar portions 11 are formed (refer to FIG. 24). The plural pillar portions 11 are provided substantially adjacent in the horizontal and vertical directions of the heat receiving plate 5A, as in a grid arrangement.

Second Press Process

The top of the pillar portion 11 is pressed down to a fixed height and enlarged in the horizontal direction, so that a cap portion 12 is formed (refer to FIG. 25).

In this way, cavity portions 13 are formed between neighboring pillar portions 11 and a bag-shaped tunnel structure is formed by covering the tops of the cavity portions 13 by the cap portions 12.

With the above-mentioned manufacturing method, a tunnel structure (bag-shaped) suiting to the shape of the boiling surface can be formed easily in a brief time only by applying the press working twice to the inner surface of the heat receiving plate 5A.

In the second press process, as the cap portion 12 is formed by pressing down the top of the pillar portion 11 to the fixed height, the height of the cap portion 12 can be lowered and as a result it is possible to design the refrigerant container so that its height is small.

Moreover, as a tunnel structure is not formed by stacking plural plates but can be formed by performing the press working to only one sheet of the heat receiving plate 5A, the number of plates is not increased and the refrigerant container can be prevented from being voluminous (high).

Still moreover, as the cavity portions 13 that form the tunnel portion are provided in a grid arrangement on the inner surface of the heat receiving plate 5A, when a refrigerant container that has a multilayer structure is manufactured by integral brazing, it is unlikely that solder clogs the entire tunnel portion even if it flows into the cavity portions 13.

Ninth Embodiment

FIG. 26 is a perspective view of the press-worked heat receiving plate 5A and another plate 14. The present embodiment is an example case in which a tunnel structure is formed on the inner surface of the heat receiving plate 5A as similar to the eighth embodiment and the other plate 14 is stacked upon the heat receiving plate 5A.

The cap portions 12 are not provided on all of the pillar portions 11 on the heat receiving plate 5A, but the pillar portions 11 without the cap portions 12 (pyramid-shaped pillar portions 11) are arranged so as to oppose the openings 14a formed in the other plate 14, as shown, for example, in FIG. 26.

The heat receiving plate 5A and the other plate 14 are stacked so that the metal portion 14b of the other plate 14 comes into contact with the tops of the cap portions 12, and the pillar portions 11 without the cap portions 12 are inserted into the openings 14a formed in the other plate, as shown in FIG. 27. In this structure, the tunnel portions (cavity portions 13) provided on the heat receiving plate 5A are not covered entirely by the cap portions 12, therefore, the evaporated refrigerant (bubble) can easily pass through and the refrigerant can easily flow into the tunnel portions in a state of boiling from the tunnel portions not in a state of boiling, so that the refrigerant can be prevented from being exhausted.

Moreover, by inserting the pillar portions 11 without the cap portions 12 into the openings 14a formed in the other plate 14, the other plate 14 can be also effectively positioned.

While the invention has been described by reference to specific embodiments chosen for the purposes of illustration, it should be apparent that numerous modifications could be made thereto by those skilled in the art without departing from the basic concept and scope of the invention.

What is claimed is:

1. A cooling apparatus boiling and condensing refrigerant: comprising a refrigerant container with a structure in which plural intermediate plates having plural openings penetrating therethrough in the direction of their thickness are stacked and both ends of the stacked intermediate plates, in the direction of stacking, are stacked by external plates, respectively, to form an inner space by the plural openings, within which a refrigerant is stored; wherein a heat-generating member, which is attached to the surface of the external plate and from which the refrigerant stored in the refrigerant container receives heat and is evaporated into vapor, is cooled by releasing the latent heat of the refrigerant vapor to the outside; wherein the intermediate plates include a first intermediate plate and a second intermediate plate that are stacked sequentially upon the external plate; and wherein if the openings provided in the first intermediate plate are referred to as first openings and the openings provided in the second intermediate plate are referred to as second openings, then the first openings and the second openings communicate with each other and the opening dimension of the communicating sections is smaller than that of the first openings.

2. A cooling apparatus boiling and condensing refrigerant, as set forth in claim 1, wherein both the first openings and the second openings are formed into an elongate slit-shape, and the width of the slits of the first openings is wider than that of the second openings.

3. A cooling apparatus boiling and condensing refrigerant, as set forth in claim 1, wherein the shapes of the first openings and the second openings are substantially similar to each other, and the opening dimension of the first openings is larger than that of the second openings.

4. A cooling apparatus boiling and condensing refrigerant, as set forth in claim 1, wherein parts of the second openings communicate with the first openings so that the opening dimension of the communicating sections, through which the first openings and the second openings communicate with each other, is kept within a fixed value.

5. A cooling apparatus boiling and condensing refrigerant, as set forth in claim 1, wherein at least two of the second openings communicate with one of the first openings.

6. A cooling apparatus boiling and condensing refrigerant: comprising a refrigerant container with a structure in which plural intermediate plates having plural openings penetrating therethrough in the direction of their thickness are stacked and both ends of the stacked intermediate plates, in the direction of stacking, are stacked by external plates, respectively, to form an inner space by the plural openings, within which a refrigerant is stored; wherein a heat-generating member, which is attached to the surface of the external plate and from which the refrigerant stored in the refrigerant container receives heat and is evaporated into vapor, is cooled by releasing the latent heat of the refrigerant vapor to the outside; wherein the intermediate plates include a first intermediate plate and a second intermediate plate that are stacked sequentially upon the external plate; wherein if the openings provided in the first intermediate plate are referred to as first openings and the openings provided in the second intermediate plate are referred to as second openings, then the first openings and the second openings communicate with each other and the opening dimension of the communicating sections is smaller than that of the first openings; and wherein the first intermediate plate has communication paths through which the plural first openings communicate with each other.

7. A cooling apparatus boiling and condensing refrigerant, as set forth in claim 6, wherein the communication path provided in the first intermediate plate enables the communication between first openings within which a refrigerant is in a state of boiling and another first openings within which a refrigerant is not in a state of boiling.

* * * * *

UNITED STATES PATENT AND TRADEMARK OFFICE
CERTIFICATE OF CORRECTION

PATENT NO.    : 6,719,040 B2  
DATED         : April 13, 2004  
INVENTOR(S)   : Hajime Sugito et al.

Page 1 of 1

It is certified that error appears in the above-identified patent and that said Letters Patent is hereby corrected as shown below:

<u>Title page,</u>  
Item [75], Inventors, delete "Yuhei Kunikata, Kariya (JP)"  
Item [57], ABSTRACT,  
Line 8, "second intermediate 5D" should be -- second intermediate plate 5D --

Signed and Sealed this

Fifth Day of April, 2005

JON W. DUDAS  
*Director of the United States Patent and Trademark Office*